(12) United States Patent
Kim et al.

(10) Patent No.: US 7,219,026 B2
(45) Date of Patent: May 15, 2007

(54) FREQUENCY MEASURING CIRCUITS INCLUDING CHARGE PUMPS AND RELATED MEMORY DEVICES AND METHODS

(75) Inventors: Hyun-Jin Kim, Gyeonggi-do (KR); Sang-Bo Lee, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 113 days.

(21) Appl. No.: 11/031,104

(22) Filed: Jan. 7, 2005

(65) Prior Publication Data

US 2005/0187724 A1 Aug. 25, 2005

(30) Foreign Application Priority Data

Feb. 20, 2004 (KR) .................. 10-2004-0011576

(51) Int. Cl.
*G06F 19/00* (2006.01)
(52) U.S. Cl. ..................................... 702/75
(58) Field of Classification Search .................. 702/75, 702/70, 71, 74, 190
See application file for complete search history.

(56) References Cited

U.S. PATENT DOCUMENTS 6,114,891 A 9/2000 Kim 7,050,522 B2 * 5/2006 Schmatz .................. 375/371
2004/0203479 A1 * 10/2004 Lin ............................ 455/73

FOREIGN PATENT DOCUMENTS

| JP | 2002-217698 | 8/2002 |
|---|---|---|
| KR | 1997-0051076 | 7/1997 |
| KR | 1999-0080383 | 11/1999 |
| KR | 2000-0003608 | 1/2000 |

OTHER PUBLICATIONS http://www.answers.com/topic/analog-to-digital-converter, p. 1-2.*
"Understanding Flash ADCs"; *A/D and D/A Conversion/Sampling Circuits*; WWW.MAXIM-IC.COM/AN810 Application Note 810: Oct. 2, 2001 pp. 1-7.

* cited by examiner

*Primary Examiner*—John E. Barlow, Jr.
*Assistant Examiner*—Tung S. Lau
(74) *Attorney, Agent, or Firm*—Myers Bigel Sibley & Sajovec

(57) ABSTRACT

A frequency measuring circuit may include an edge detector, a charge pump, and an analog-to-digital (A/D) converter. The edge detector may be configured to generate an output pulse responsive to an edge of an input clock signal. The charge pump may be configured to generate an output signal responsive to the output pulse from the edge detector. The analog-to-digital (A/D) converter may be configured to convert the output signal into a digital value representing a frequency of the input clock signal. Related methods and integrated circuit memory devices are also discussed.

21 Claims, 8 Drawing Sheets

FREQUENCY MEASURING CIRCUITS INCLUDING CHARGE PUMPS AND RELATED MEMORY DEVICES AND METHODS

CROSS-REFERENCE TO RELATED APPLICATION

This application claims the benefit of and priority under 35 U.S.C. § 119 to Korean Patent Application No. 2004-11576, filed Feb. 20, 2004, the disclosure of which is hereby incorporated herein by reference in its entirety.

FIELD OF THE INVENTION

The present invention relates to electronic devices, and more particularly, to frequency measuring circuits and related methods.

BACKGROUND

A semiconductor memory device may receive clock signals having different frequencies. Internal circuits of the semiconductor memory device may not show a same performance for all frequencies and may thus need to perform operations depending on a frequency of an input clock signal. For example, a delay locked loop (DLL) may be used to generate an internal clock signal which is synchronized with a clock signal input from an external portion. In this case, the internal clock signal can be synchronized with the external clock signal even though a delay circuit having a short delay time is used if a frequency of the external clock signal is high. When a frequency of the external clock signal is low, however, the internal clock signal may be synchronized with the external clock signal only if a delay circuit having a relatively long delay time is used. An awareness of a frequency information of the input clock signal may be used to improve frequency characteristics of the internal circuits of the semiconductor memory device.

Figure 1:
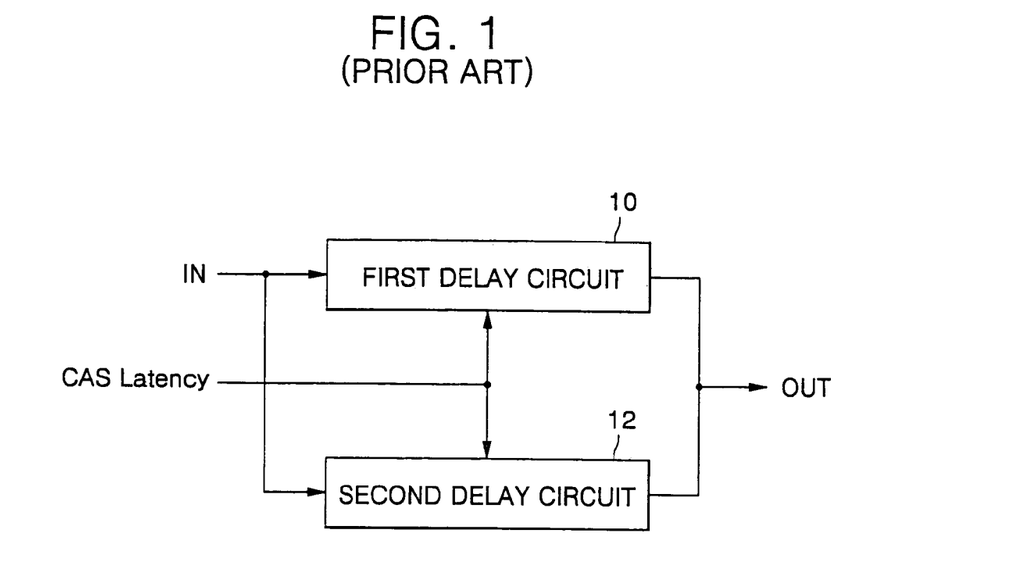
FIG. 1 is a block diagram illustrating a circuit used when different delays are used for clock signals of different frequencies in a conventional semiconductor memory device.

A conventional semiconductor memory device may use a CL (CAS latency) value set by a user as frequency information for a clock signal. FIG. 1 is a block diagram illustrating a circuit used when different delays are used according to a frequency of a clock signal in a conventional semiconductor memory device. Functions and operations of components of FIG. 1 are explained below.

One of a first delay circuit 10 and a second delay circuit 20 is selected according to a CL value, and an output signal OUT is generated by delaying an input signal IN by a predetermined time period. That is, in a conventional semiconductor memory device, a CL value is set differently according to a frequency of the input clock signal, and a generation time point of internally generated signals depends on a frequency of the input clock signal. Therefore, if a user sets a CL value according to a frequency of a clock signal to be used, the circuit of FIG. 1 selects the first delay circuit 10 or the second delay circuit 12 according to the CL value to make a generation time point of the output signal OUT.

Figure 2:
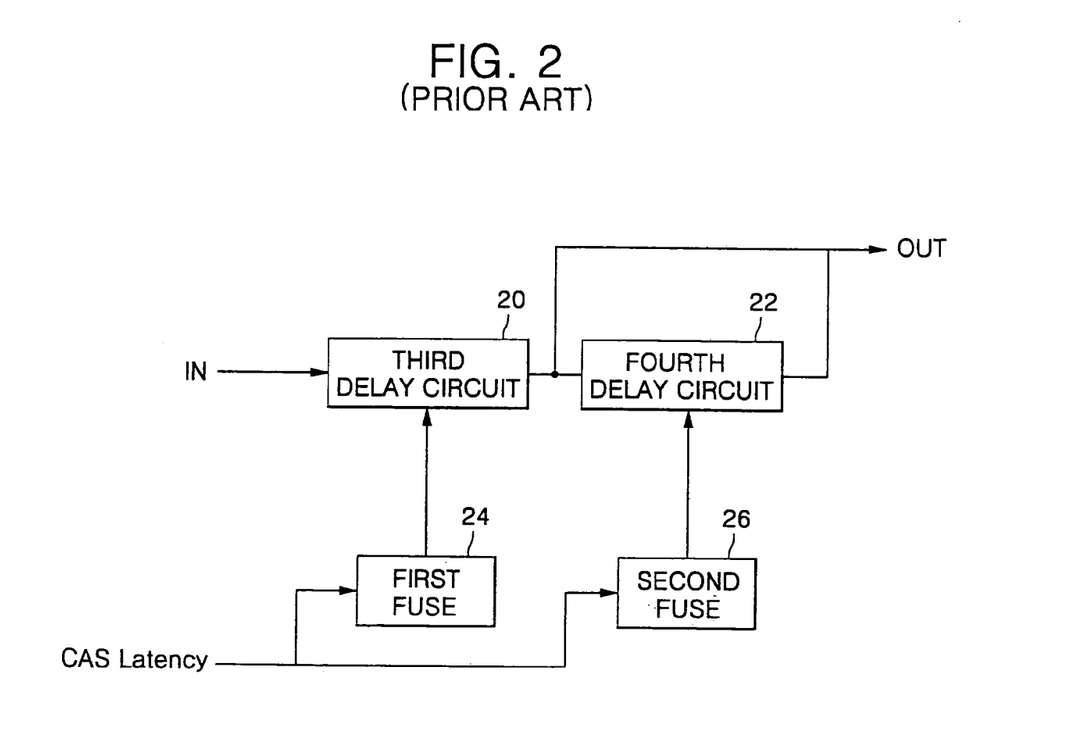
FIG. 2 is a block diagram illustrating a method of adjusting a delay time of a delay circuit according to a frequency of an externally input clock signal in a delay locked loop (DLL) of a conventional semiconductor memory device.

FIG. 2 is a block diagram illustrating a method of adjusting a delay time of a delay circuit according to a frequency of an externally input clock signal in the delay locked loop (DLL) of the conventional semiconductor memory device. In FIG. 2, a third delay circuit 20 and a fourth delay circuit 22 may each have multiple different delay circuits.

A delay locked loop (DLL) may be used to synchronize an internal clock signal with an external clock signal in a semiconductor memory device. As described above, if a delay locked loop is used in a semiconductor memory device, the internal clock signal can be synchronized with the external clock signal even though a delay circuit having a short delay time is used when a frequency of the external clock signal is high. In contrast, a delay circuit having a relatively long delay time may be needed when a frequency of the external clock signal is low. The semiconductor memory device of FIG. 2 generates a relatively short delay time period by cutting a second fuse 24 using a CL value set by a user for the third delay circuit 20 to generate the internal clock signal and for the fourth delay circuit 22 to not operate when a frequency of a clock signal is high. The semiconductor memory device of FIG. 2 generates a relatively long delay time period such that the internal clock signal is generated through both the third delay circuit 20 and the fourth delay circuit 22 without cutting the first and second fuses 24 and 26.

If a CL value is used as frequency information for a clock signal, however, there may be a problem in that a user should change a CL value whenever a frequency of a clock signal input to the semiconductor memory device is varied. The semiconductor memory device may operate abnormally if a user makes a mistake in setting a CL value.

SUMMARY OF THE INVENTION

According to some embodiments of the present invention, a frequency measuring circuit may include an edge detector, a charge pump, and an analog-to-digital converter. The edge detector may be configured to generate an output pulse responsive to an edge of an input clock signal. The charge pump may be configured to generate an output signal responsive to the output pulse from the edge detector. The analog-to-digital (A/D) converter may be configured to convert the output signal into a digital value representing a frequency of the input clock signal.

In addition, an encoder may be configured to convert the digital value into a frequency information signal representing a frequency of the input clock signal. More particularly, the frequency information signal may have a first value when the frequency of the input clock signal is less than a first threshold, a second value when the frequency of the input clock signal is less than a second threshold and greater than or equal to the first threshold, and a third value when the frequency of the input clock signal is greater than or equal to the second threshold.

The edge detector may be configured to generate the output pulse responsive to rising and falling edges of the input clock signal. Moreover, the edge detector may include a delay circuit and a logic circuit. The delay circuit may be configured to generate a delayed clock signal by delaying the clock signal by a time period. The logic circuit may be configured to combine the clock signal and the delayed clock signal to generate the output pulse. More particularly, the delay circuit may include a plurality of serially connected inverters, and the logic circuit may include an exclusive OR gate having a first input coupled to the clock signal and a second input coupled to the delayed clock signal. The edge detector may be configured to generate the output pulse responsive to each rising and falling edge of the input clock signal, and each output pulse from the edge detector may have a same duration.

The charge pump may include a capacitor and a charging transistor coupled in series between a power supply and the capacitor. The charging transistor may be configured to charge the capacitor responsive to the output pulse from the edge detector. The charge pump may also include a discharge circuit configured to discharge the capacitor.

The analog-to-digital (A/D) converter may include a plurality of resistors and a plurality of comparators. The plurality of resistors may be connected in series between a power supply voltage and a reference voltage, and the plurality of serially connected resistors may be configured to provide a plurality of reference voltages. A first input of each comparator may be coupled to a respective one of the reference voltages and a second input of each comparator may be coupled to the output signal from the charge pump.

The analog-to-digital (A/D) converter may be a flash converter configured to convert the output signal into a thermometer code type digital value. In addition, an internal clock signal generator may be configured to generate an internal clock signal for memory operations responsive to the digital value representing the frequency of the input clock signal.

According to additional embodiments of the present invention, a method of measuring a frequency of an input clock signal may include generating an output pulse responsive to an edge of the input clock signal. A circuit may be charged responsive to the output pulse from the edge detector, and an output signal from the charged circuit may be converted into a digital value representing a frequency of the input clock signal.

In addition, the digital value may be converted into a frequency information signal representing a frequency of the input clock signal. More particularly, the frequency information signal may have a first value when the frequency of the input clock signal is less than a first threshold, a second value when the frequency of the input clock signal is less than a second threshold and greater than or equal to the first threshold, and a third value when the frequency of the input clock signal is greater than or equal to the second threshold.

Generating the output pulse may include generating the output pulse responsive to rising and falling edges of the input clock signal. More particularly, generating the output pulse may include delaying the clock signal by a time period to generate a delayed clock signal, and combining the clock signal and the delayed clock signal to generate the output pulse. Combining the clock signal and the delayed clock signal may include performing an exclusive OR operation on the clock signal and on the delayed clock signal. Generating the output pulse may include generating the output pulse responsive to each rising and falling edge of the input clock signal, and each output pulse may have a same duration.

Charging the circuit may include charging a capacitor responsive to the output pulse, and the digital value representing a frequency of the input clock may be a thermometer code type digital value. In addition, an internal clock signal may be generated for memory operations responsive to the digital value representing the frequency of the input clock signal.

According to yet additional embodiments of the present invention, an integrated circuit memory device may include a frequency measuring circuit, an internal clock signal generator, and a memory cell array. The frequency measuring circuit may include an edge detector configured to generate an output pulse responsive to an edge of an input clock signal, a charge pump configured to generate an output signal responsive to the output pulse from the edge detector, and an analog-to-digital (A/D) converter configured to convert the output signal into a digital value representing a frequency of the input clock signal. The internal clock signal generator may be configured to generate an internal clock signal responsive to the digital value representing the frequency of the input clock signal. The memory cell array may be configured to perform read and/or write operations responsive to the digital value representing the frequency of the input clock signal.

More particularly, the edge detector may be configured to generate the output pulse responsive to rising and falling edges of the input clock signal. The edge detector may include a delay circuit and a logic circuit. The delay circuit may be configured to generate a delayed clock signal by delaying the clock signal by a time period. The logic circuit may be configured to combine the clock signal and the delayed clock signal to generate the output pulse.

The charge pump may include a capacitor and a charging transistor coupled in series between a power supply voltage and the capacitor. The charging transistor may be configured to charge the capacitor responsive to the output pulse from the edge detector. Moreover, the analog-to-digital (A/D) converter may include a flash analog-to-digital converter.

According to some embodiments of the present invention, a frequency measuring circuit may automatically detect frequency information of an input clock signal without a setting by a user.

According to some embodiments of the present invention, a semiconductor memory device may have a frequency measuring circuit which can automatically detect frequency information of an input clock signal without a setting by a user.

According to some embodiments of the present invention, a frequency measuring circuit may include an edge detecting portion for detecting an edge of a clock signal input from an external portion to generate a control signal. A charge pump may output a voltage corresponding to a frequency of the clock signal in response to the control signal, and an A/D converter may convert the voltage into a digital value.

The frequency measuring circuit may further include an encoder for converting the digital value into a frequency information signal. The edge detecting portion may detect a rising edge and a falling edge of the clock signal to output a control signal of a pulse type. The edge detecting portion may include a delay circuit for delaying the clock signal by a predetermined time period, and a logic element for combining the clock signal and an output signal of the delay circuit to generate the control signal. The delay circuit may include a plurality of inverters which are connected in series.

The logic element may be an exclusive OR gate which has one terminal to which the clock signal is applied and another terminal to which the output signal of the delay circuit is applied. The charge pump may include a transmission transistor for transmitting charge in response to the control signal, and a capacitor for receiving charge transmitted from the transmission transistor. The charge pump may further include a discharger for discharging charge from capacitor. The A/D converter may include resistors for generating a plurality of comparison voltages, and comparators may respectively compare the comparison voltages to the voltage corresponding to the frequency of the clock signal. Moreover, the A/D converter may output a digital value of a thermometer code type.

The inverter may generate a frequency information signal which represents that the clock signal is a high frequency when the digital value is equal to or greater than a first value. The frequency information signal may represents that the clock signal is a low frequency when the digital value is equal to or greater than a second value. The frequency information signal may represent that the clock signal is an intermediate frequency when the digital value is between the first value and the second value.

According to further embodiments of the present invention, a semiconductor memory device may include a frequency measuring circuit including an edge detecting portion for detecting an edge of a clock signal input from an external portion to generate a control signal. A charge pump may output a voltage corresponding to a frequency of the clock signal in response to the control signal. A/D converter may convert the voltage into a digital value with a frequency of the clock signal being measured by the frequency measuring circuit.

The frequency measuring circuit may further include an encoder for converting the digital value into a signal.

The edge detecting portion may detect a rising edge and a falling edge of the clock signal to output a control signal of a pulse type. The edge detecting portion may include a delay circuit for delaying the clock signal by a predetermined time period. A logic element may combine the clock signal and an output signal of the delay circuit to generate the control signal.

The charge pump may include a transmission transistor for transmitting charges in response to the control signal. A capacitor may receive charge transmitted from the transmission transistor. The charge pump may further include a discharger for discharging charge from the capacitor.

The A/D converter may include resistors for generating a plurality of comparison voltages. Comparators may respectively compare the comparison voltages to the voltage corresponding to the frequency of the clock signal, with the A/D converter outputting the digital value of a thermometer code type.

BRIEF DESCRIPTION OF THE DRAWINGS

The above and other features and advantages of the present invention will become more apparent to those of ordinary skill in the art by describing in detail embodiments thereof with reference to the attached drawings.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another embodiment, element, component region, layer or section. Thus, a first embodiment, component, element, region, layer or section discussed below could be termed a second embodiment, component, element, region, layer or section, and, similarly, a second embodiment, component, element, region, layer or section could be termed a first embodiment, component, element, region, layer or section without departing from the teachings of the present invention.

It will also be understood that when an element is referred to as being "connected to" or "coupled to" another element, it can be directly "connected to" or "coupled to" the other element or intervening elements may also be present. In contrast, if an element is referred to as being directly "connected to" or "coupled to" another element, then no other intervening elements are present. The term "directly" means that there are no intervening elements. Finally, as used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
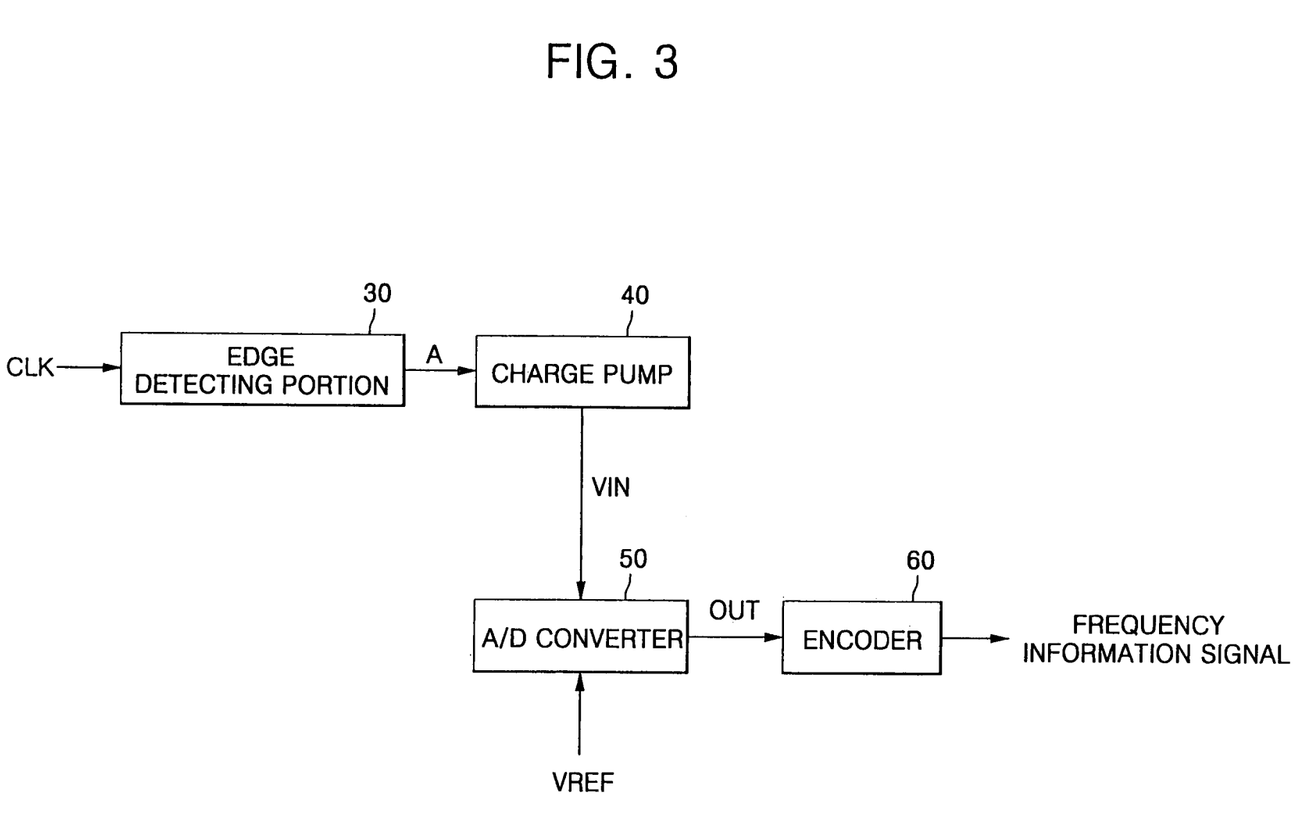
FIG. 3 is a block diagram illustrating frequency measuring circuits according to some embodiments of the present invention.

FIG. 3 is a block diagram illustrating frequency measuring circuits according to some embodiments of the present invention. The frequency measuring circuit of FIG. 3 may include an edge detecting portion 30, a charge pump 40, an A/D converter 50, and an encoder 60. Functions of components of the frequency measuring circuit of FIG. 3 are explained in greater detail below.

The edge detecting portion 30 generates a control signal A in the form of a pulse having a predetermined pulse width at every rising edge and every falling edge of a clock signal which is externally input. The charge pump 40 generates a charge in response to the control signal A input from the edge detecting portion 30, and outputs a voltage VIN corresponding to the generated charge. The A/D converter 50 compares a reference voltage VREF to the voltage VIN input from the charge pump 40 to convert a value corresponding to the voltage VIN into a digital value OUT of a thermometer code type, such as provided, for example, using a flash analog-to-digital converter. The reference voltage VREF may be supplied from an external portion or internally generated, and the reference voltage VREF may be set to be equal to a maximum value of the voltage VIN output from the charge pump 40. The encoder 60 may convert the digital value OUT of a thermometer code type from the A/D converter 50 into a frequency information signal representing frequency information as a binary code or other type.

Figure 4:
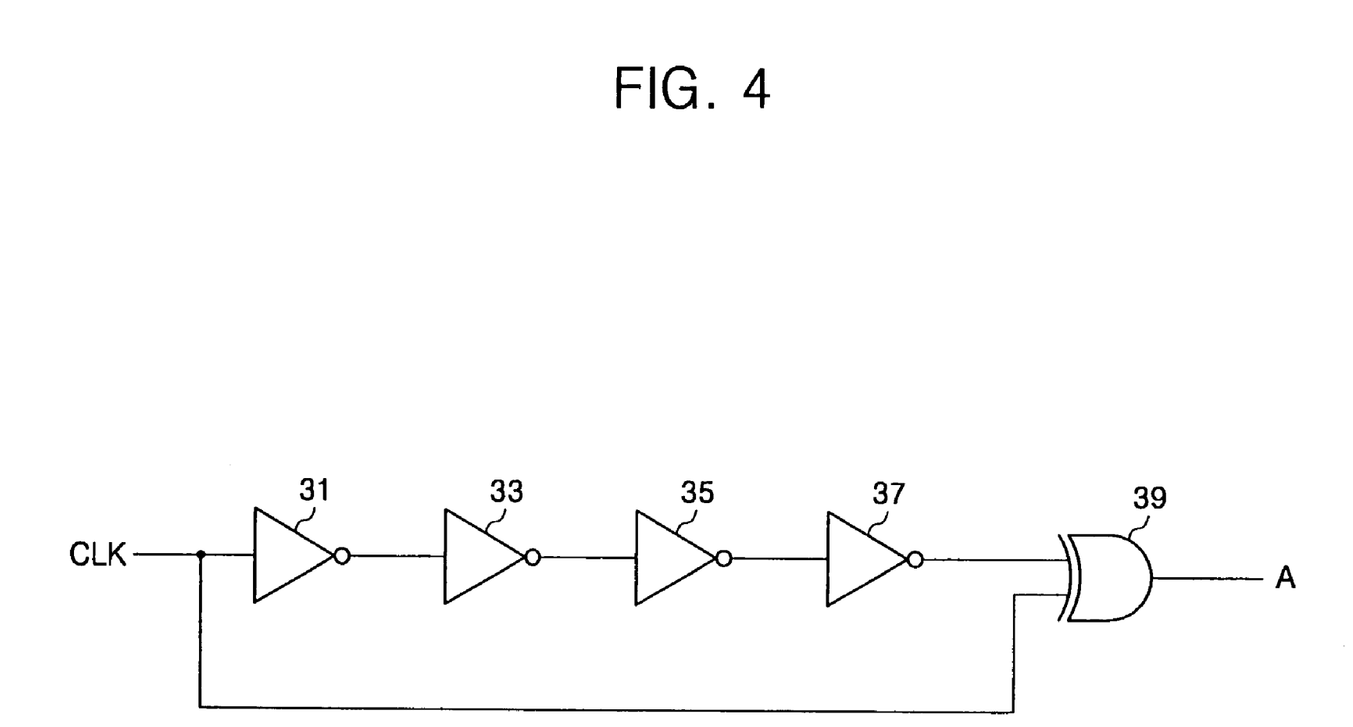
FIG. 4 is a circuit diagram illustrating an edge detecting portion of the frequency measuring circuit of FIG. 3.

FIG. 4 is a circuit diagram illustrating an embodiment of the edge detecting portion of the frequency measuring circuit of FIG. 3. The edge detecting portion of FIG. 4 includes inverters 31, 33, 35, and 37, and exclusive OR gate 39. Functions of the components of the edge detecting portion of FIG. 4 are discussed in greater detail below.

CLK denotes a clock signal input from an external portion. The inverters 31, 33, 35, and 37 delay the clock signal CLK by a predetermined time period. The exclusive OR gate 39 outputs a signal having a logic "0" when the clock signal CLK and a delay signal delayed by a predetermined time period by the inverters 31, 33, 35, and 37 have a same logic value. The exclusive NOR gate 39 outputs a signal having a logic "1" when the clock signal CLK and a delay signal delayed by a predetermined time period by the inverters 31, 33, 35, and 37 have different logic values.

Figure 5A:
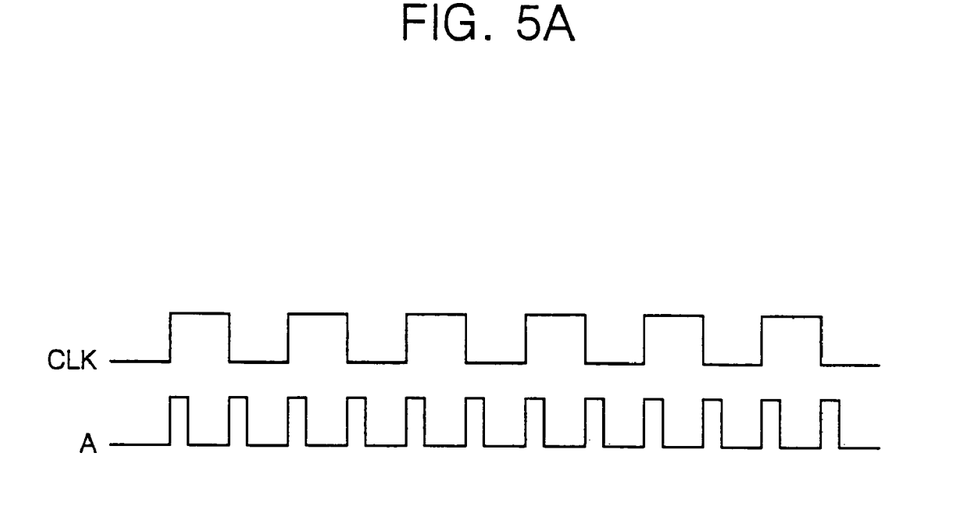
FIGS. 5A–B are timing diagrams illustrating operations of the edge detecting portion of FIG. 4 for different frequencies of a clock signal.
Figure 5B:
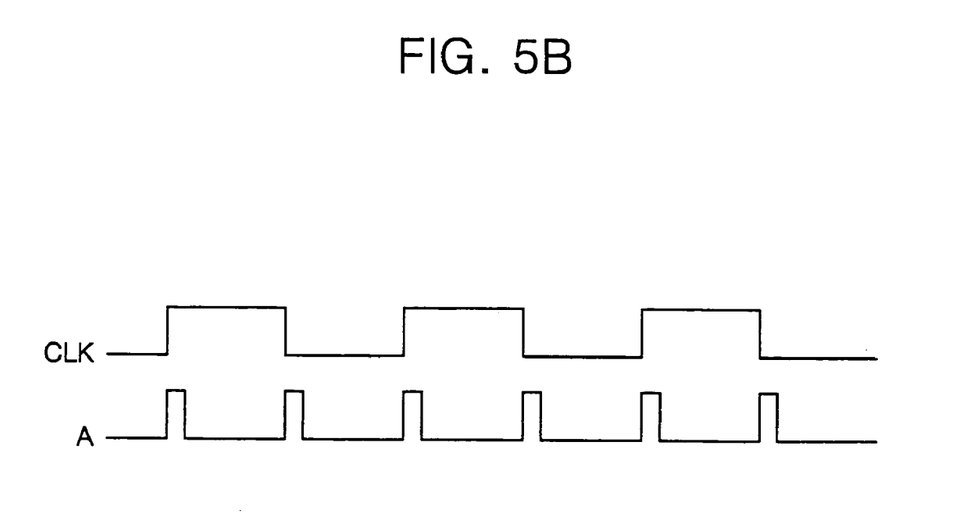

FIGS. 5a and 5b are timing diagrams illustrating operations of the edge detecting portion according to a frequency of a clock signal. FIG. 5a shows an example with a relatively high frequency clock signal, and FIG. 5b shows an example with a relatively low frequency clock signal. Operations of the edge detecting portion of FIG. 4 are explained with reference to FIGS. 5a and 5b.

When a clock signal CLK is input from an external portion to the edge detecting portion 30, the clock signal is input to one terminal of the exclusive OR gate 39 "as is" and the delayed clock signal provided using the inverters 31, 33, 35, and 37 is input to the other terminal of the exclusive OR gate 39. That is, different values are input to terminals of the exclusive OR gate 39 for a predetermined time period at every rising edge and every falling edge of the clock signal, and a same value is input during a rest time period. Therefore, the exclusive OR gate 39 generates a control signal A in the form of a pulse having a pulse width corresponding to the delay of the inverters 31, 33, 35, and 37 at every rising edge and every falling edge of a clock signal CLK which is externally input. Therefore, as shown in FIGS. 5a and 5b, the control signal A which is an output signal of the edge detecting portion is relatively high in pulse generation frequency when a frequency of the clock signal CLK which is input from an external portion is relatively high (FIG. 5a), and is relatively low in pulse generation frequency when a frequency of the clock signal CLK which is input from an external portion is relatively low (FIG. 5b). That is, the pulse width of the control signal A is determined by the number of the inverters of the edge detecting portion of FIG. 4. A time that the control signal A has a "low" level is thus shortened when the clock signal CLK has a relatively high frequency (FIG. 5a). In contrast, a time that the control signal A has a "low" level is lengthened when the clock signal CLK has a relatively low frequency (FIG. 5b).

Figure 6:
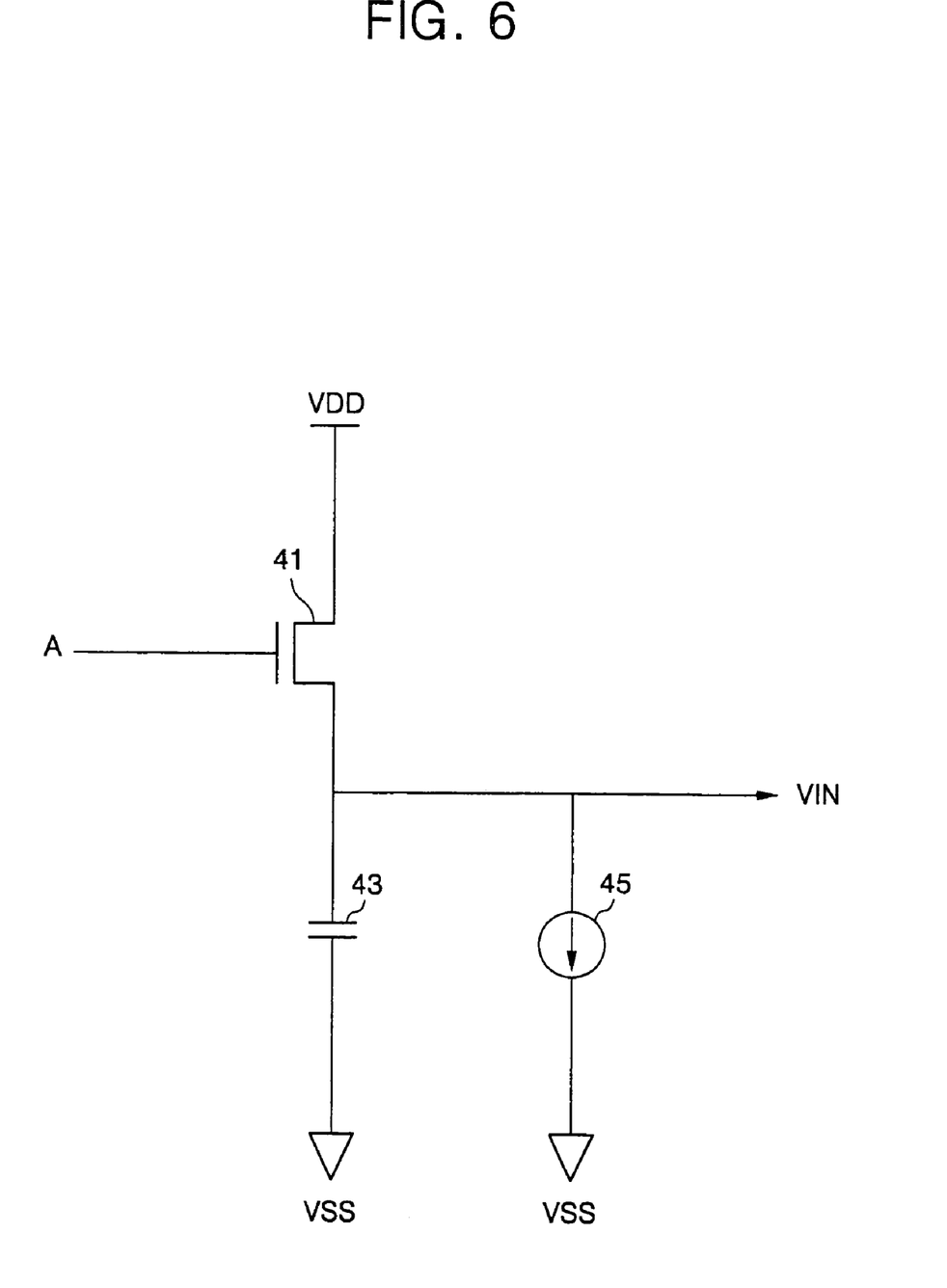
FIG. 6 is a circuit diagram illustrating a charge pump of the frequency measuring circuit of FIG. 3.

FIG. 6 is a circuit diagram illustrating an example of the charge pump 40 of the frequency measuring circuit of FIG. 3. The charge pump of FIG. 6 includes a transistor 41, a capacitor 43, and a discharger 45. Here, the control signal A output from the edge detecting portion 30 is applied to a gate of the transistor 41. Functions of components of the charge pump of FIG. 6 are discussed in greater detail below.

The transistor 41 charges the capacitor 43 in response to the control signal A input from the edge detecting portion 30. The capacitor 43 generates a voltage VIN corresponding to a charge thereof. The discharger 45 discharges a charge of the capacitor 43 by a predetermined amount. That is, the capacitor 43 is charged during a time period that the control signal A has a logic "high" level, and the discharger 45 discharges charge from the capacitor 43 at a constant rate regardless of the control signal A. Therefore, when a frequency of a pulse of the control signal A is relatively high, a rate of discharge through discharger 45 may be small relative to a rate of charge through transistor 41, and relatively large amount of charge may be charged to the capacitor. When a frequency of a pulse of the control signal A is relatively low, a rate of discharge through the discharger 45 may be large relative to a rate of charge through transistor 41, and a relatively small amount of charge may be charged to the capacitor.

As described above, when a frequency of the clock signal input from an external portion is relatively high, a generation frequency of a pulse of the control signal A is relatively high, and thus a relatively large amount of charge may be charged to the capacitor 43, and a voltage VIN output from the charge pump 40 may be increased. On the other hand, when a frequency of the clock signal input from an external portion is relatively low, a generation frequency of a pulse of the control signal A is relatively low, and thus a relatively small amount of charge may be charged to the capacitor 43, and a voltage VIN output from the charge pump 40 may be reduced. The charge pump 40 may be configured to generate the voltage VIN when the semiconductor memory device begins its operation to generate a first internal clock signal. In addition or in an alternative, the charge pump 40 may be configured to generate the voltage VIN periodically and/or after a predetermined number of clock signals.

Figure 7:
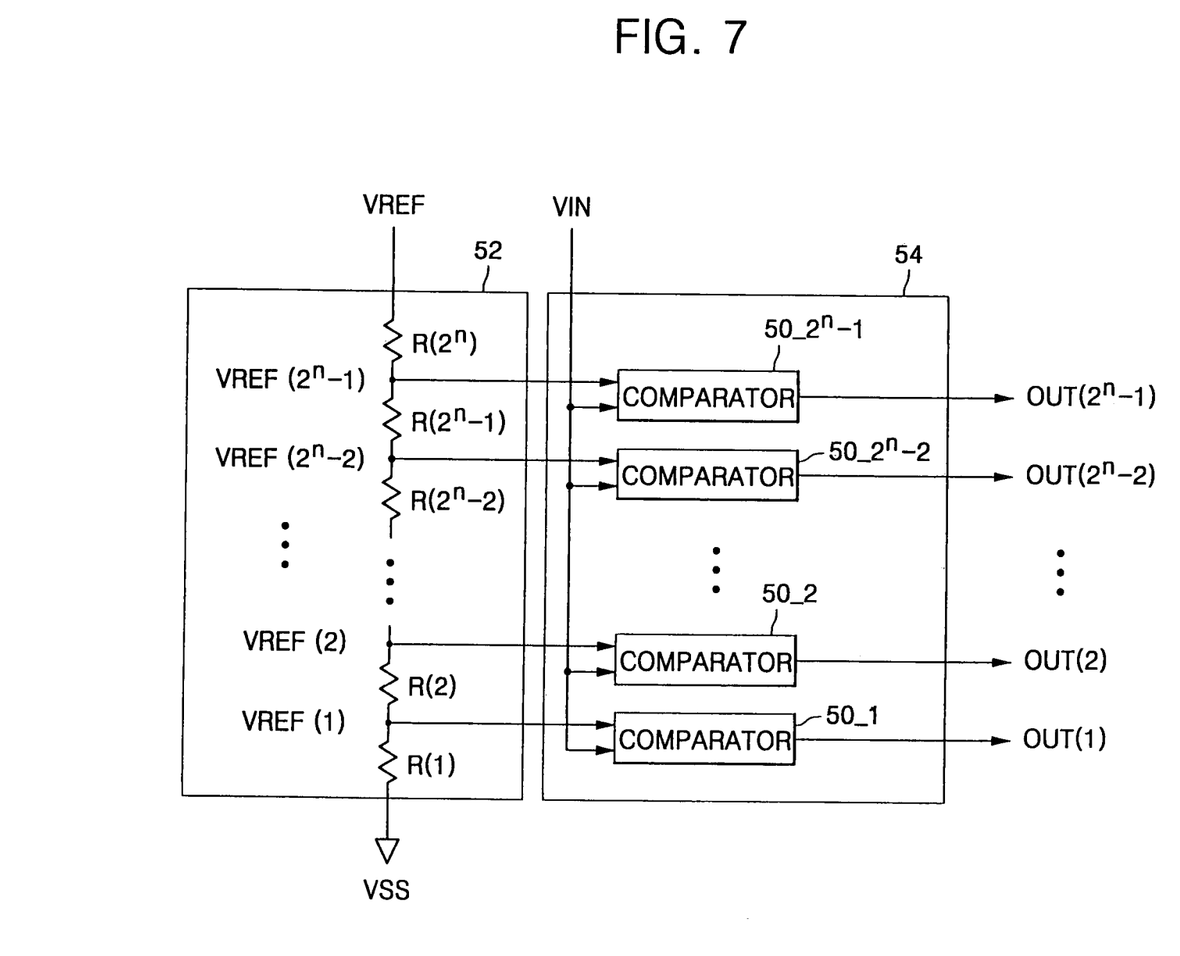
FIG. 7 is a block diagram illustrating an A/D converter of the frequency measuring circuit of FIG. 3.

FIG. 7 is a block diagram illustrating an example of an A/D (analog-to-digital) converter of the frequency measuring circuit of FIG. 3. The A/D converter of FIG. 7 includes a comparison voltage generating portion 52 and a comparison circuit portion 54. To provide n-bit resolution, the comparison voltage generating portion 52 includes $2^n$ resistors $R(1)$ to $R(2^n)$, and the comparison circuit portion 54 includes $(2^n-1)$ comparators 50_1 to 50_$2^n$-1. Functions of components of the A/D converter of FIG. 7 are discussed in greater detail below.

The comparison voltage generating portion 52 divides a reference voltage VREF using $2^n$ resistors and provides comparison voltages $VREF(1)$ to $VREF(2^n-1)$. The comparison circuit portion 54 compares the voltage VIN to the comparison voltages $VREF(1)$ to $VREF(2^n-1)$ to generate digital values $OUT(1)$ to $OUT(2^n-1)$ of a thermometer code type. The analog-to-digital converter of FIG. 7 may thus be a flash analog-to-digital converter. Flash analog-to-digital converters are discussed, for example, in the reference entitled "Understanding Flash ADCs," published by Maxim, Dallas Semiconductor, APP 810, Oct. 2, 2001, the disclosure of which is hereby incorporated herein in its entirety.

Figure 8A:
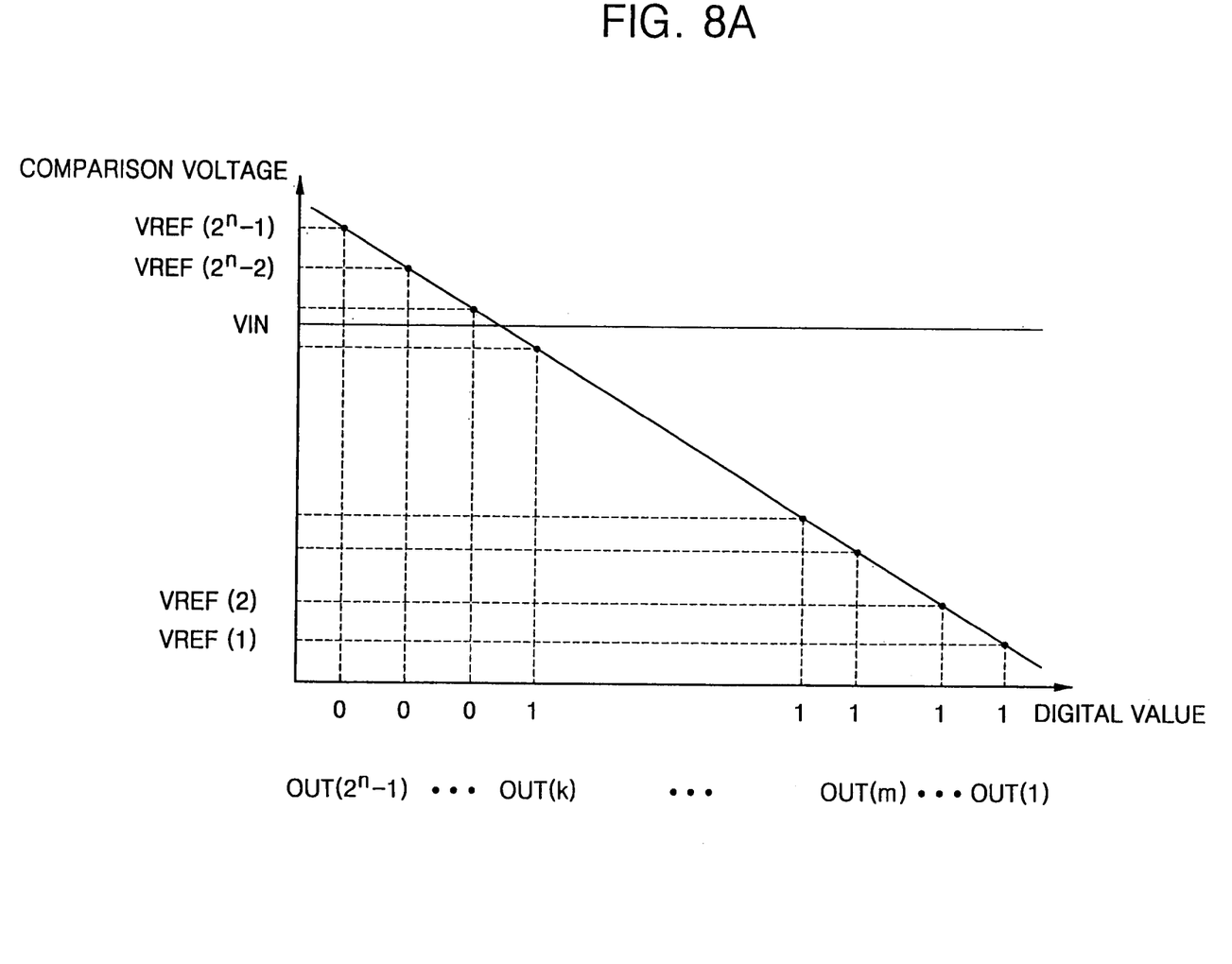
FIGS. 8A–B are graphs illustrating operations of the A/D converter of FIG. 7.
Figure 8B:
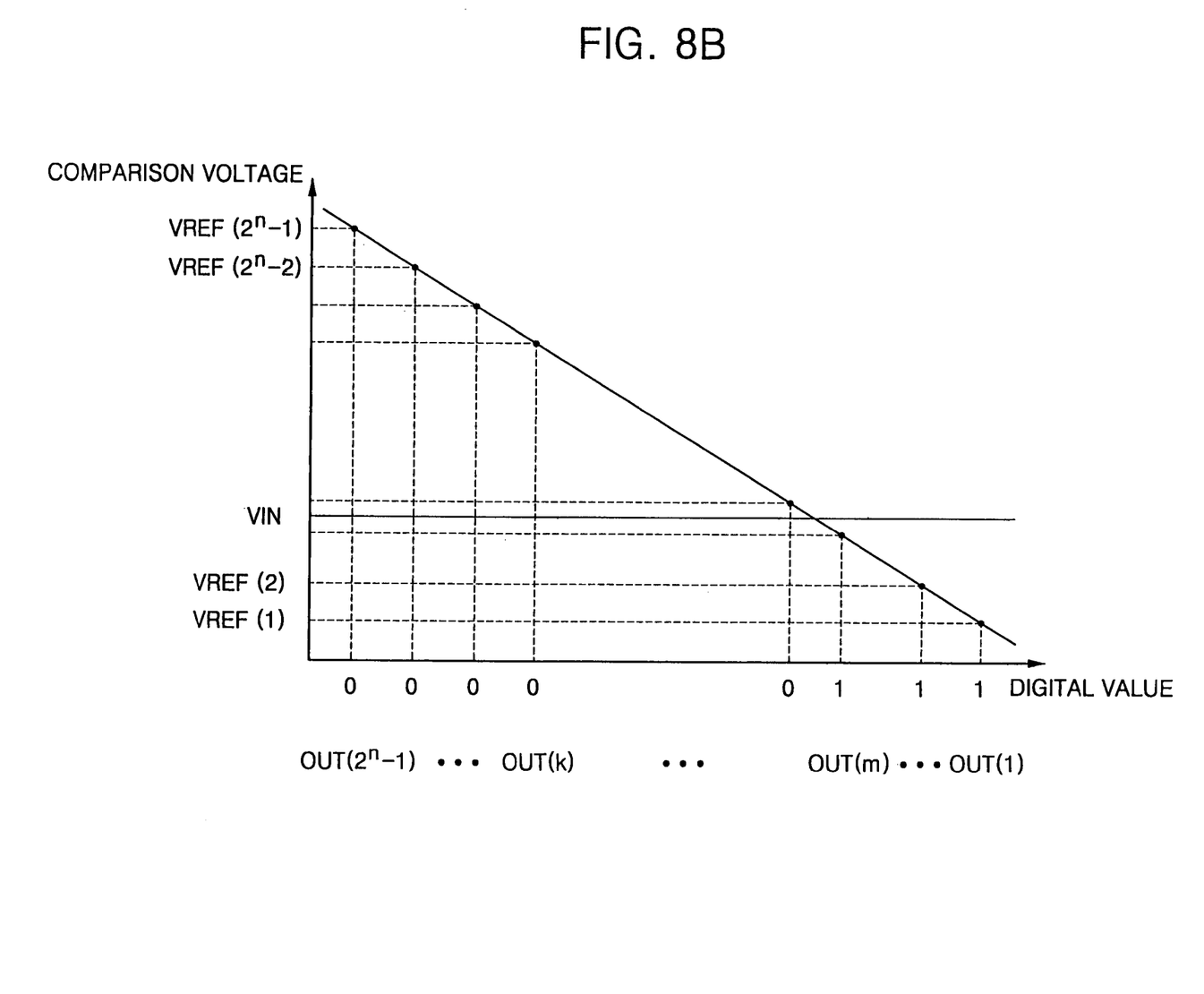

FIGS. 8a and 8b are graphs illustrating operations of the A/D converter of FIG. 7. FIG. 8a illustrates an example with a clock signal from an external portion having a relatively high frequency. FIG. 8b illustrates an example with a clock signal from an external portion having a relatively low frequency. Operation of the A/D converter of FIG. 7 is discussed in greater detail below with reference to FIGS. 8a and 8b.

The comparison voltages VREF(1) to VREF($2^n$-1) generated by dividing the reference voltage VREF using $2^n$ resistors. R(1) to R($2^n$) are applied to respective terminals of the comparators 50_1 to 50_$2^n$-1, and the voltage VIN output from the charge pump 40 is applied to the remaining terminal of each of the comparators. The reference voltage VREF may have a value corresponding to a maximum value of the voltage VIN output the charge pump. If the resistors R(1) to R($2^n$) have a same resistance, the comparison voltage provided to the respective comparators can be represented by the following equations:

$$VREF(1) = VREF * \frac{1}{2^n};$$

$$VREF(2) = VREF * \frac{2}{2^n}; \text{ and}$$

...

$$VREF(2^n - 1) = VREF * \frac{2^n - 1}{2^n}.$$

Each of the comparators 50_1 to 50_$2^n$-1 respectively compare the comparison voltages VREF(1) to VREF($2^n$-1) to the voltage VIN from the charge pump 40 to generate a logic "1" when the voltage VIN is greater than the comparison voltage. Each of the comparators 50_1 to 50_$2^n$-1 respectively generates a logic "0" when the voltage VIN is smaller than the comparison voltage. As described above, a level of the voltage VIN is high when a frequency of the clock signal is relatively high (FIG. 8a), and a level of the voltage VIN may be relatively low when a frequency of the clock signal is relatively low.

When a frequency of the clock signal is relatively high (FIG. 8a), first to kth comparators 50_1 to 50_k have respective comparison voltages VREF(1) to VREF(k) that are less than the voltage VIN, and (k+1)th to ($2^n$-1)th comparators 50_k+1 to 5_$2^n$-1 have respective comparison voltages VREF(k+1) to VREF ($2^n$-1) that are greater than the voltage VIN. Therefore, the comparators 50_1 to 50_k to which the voltage VIN greater than the respective comparison voltage is applied generate a logic "1" (OUT(1) to OUT(k)), and the comparators 50_k+1 to 50_$2^n$-1 to which the voltage VIN less than the comparison voltage is applied generate a logic "0" (OUT(k+1) to OUT($2^n$-1)).

When a frequency of the clock signal is relatively low (FIG. 8b), first to mth comparators 50_1 to 50_$m$ (with m being smaller than k) have the respective comparison voltages VREF(1) to VREF(m) that are less than the voltage VIN, and (m+1)th to ($2^n$-1)th comparators 50_$m$+1 to 50_$2^n$-1 have the respective comparison voltages VREF (m+1) to VREF ($2^n$-1) that are greater than the voltage VIN. Therefore, the comparators 50_1 to 50_$m$ to which the voltage VIN greater than the comparison voltage is applied generate a logic "1" (OUT(1) to OUT(m)), and the comparators 50_(m+1) to 50_($2^n$-1) to which the voltage VIN less than the comparison voltage is applied generate a logic "0" (OUT(m+1) to OUT($2^n$-1)).

The A/D converter 50 according to some embodiments of the present invention may have a flash A/D converter structure which can convert the voltage VIN having an analog value into a digital value of a thermometer code type. Therefore, just one cycle may be required for all comparators to simultaneously output results and convert the voltage VIN into a digital value, thereby thereby providing relatively high speed operation.

An encoder may be provided that converts the digital value of the thermometer code type into a frequency information signal to use frequency information of the clock signal in the semiconductor memory device. The encoder may be configured to covert the digital value of the thermometer code type into a frequency information signal of a binary code type. In addition or in an alternative, the encoder may be configured to generate a frequency information signal which represents that the clock signal is a high frequency signal when the digital value is equal to or greater than a first value, to generate a frequency information signal which represents that the clock signal is a low frequency signal when the digital value is equal to or less than a second value, and to generate a frequency information signal which represents that the clock signal is an intermediate frequency signal when the digital value is between the first value and the second value.

As described herein before, frequency measuring circuits according to some embodiments of the present invention can automatically provide frequency information for the clock signal so that a user is not required to provide the frequency information of the clock signal.

Furthermore, semiconductor memory devices having frequency measuring circuits according to some embodiments of the present invention may reduce abnormal operations resulting from user mistakes in setting the frequency information because a user does not need to change the setting information for the frequency of the clock signal even though a frequency of the clock signal is changed.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A frequency measuring circuit comprising:
   an edge detector configured to generate an output pulse responsive to an edge of an input clock signal;
   a charge pump configured to generate an output signal responsive to the output pulse from the edge detector wherein the charge pump includes, a capacitor, and a charging transistor coupled in series between a power supply voltage and the capacitor, the charging transistor being configured to charge the capacitor responsive to the output pulse from the edge detector; and
   an analog-to-digital (A/D) converter configured to convert the output signal into a digital value representing a frequency of the input clock signal.

2. A frequency measuring circuit according to claim 1 further comprising:
   an encoder configured to convert the digital value into a frequency information signal representing a frequency of the input clock signal.

3. A frequency measuring circuit according to claim 2 wherein the frequency information signal has a first value when the frequency of the input clock signal is less than a first threshold, wherein the frequency information signal has a second value when the frequency of the input clock signal is less than a second threshold and greater than or equal to the first threshold, and wherein the frequency information signal has a third value when the frequency of the input clock signal is greater than or equal to the second threshold.

4. A frequency measuring circuit according to claim 2 wherein the analog-to-digital converter is configured to generate the digital value as a thermometer code type value, and wherein the encoder is configured to generate the frequency information signal as a binary code type value.

5. A frequency measuring circuit according to claim 1 wherein the edge detector is configured to generate the output pulse responsive to rising and falling edges of the input clock signal.

6. A frequency measuring circuit according to claim 5 wherein the edge detector includes:
a delay circuit configured to generate a delayed clock signal by delaying the clock signal by a time period; and
a logic circuit configured to combine the clock signal and the delayed clock signal to generate the output pulse.

7. A frequency measuring circuit according to claim 6 wherein the delay circuit includes a plurality of serially connected inverters.

8. A frequency measuring circuit according to claim 6 wherein the logic circuit comprises an exclusive OR gate having a first input coupled to the clock signal and a second input coupled to the delayed clock signal.

9. A frequency measuring circuit according to claim 5 wherein the edge detector is configured to generate the output pulse responsive to each rising and falling edge of the input clock signal.

10. A frequency measuring circuit according to claim 9 wherein each output pulse from the edge detector has a same duration.

11. A frequency measuring circuit according to claim 1 wherein the charge pump further includes:
a discharge circuit configured to discharge the capacitor.

12. A frequency measuring circuit according to claim 1 wherein the analog-to-digital (A/D) converter includes:
a plurality of resistors connected in series between a power supply voltage and a reference voltage, the plurality of serially connected resistors being configured to provide a plurality of reference voltages; and
a plurality of comparators with a first input of each comparator being coupled to a respective one of the reference voltages and a second input of each comparator being coupled to the output signal from the charge pump.

13. A frequency measuring circuit according to claim 1 wherein the analog-to-digital (A/D) converter is configured to convert the output signal into a thermometer code type digital value.

14. A frequency measuring circuit according to claim 1 wherein the analog-to-digital (A/D) converter comprises a flash analog-to-digital converter.

15. A frequency measuring circuit according to claim 1 further comprising:
an internal clock signal generator configured to generate an internal clock signal for memory operations responsive to the digital value representing the frequency of the input clock signal.

16. A frequency measuring circuit according to claim 1 wherein the output pulse generated by the edge detector has a constant time delay between its rising edge and its falling edge.

17. An integrated circuit memory device comprising:
frequency measuring circuit including an edge detector configured to generate an output pulse responsive to an edge of an input clock signal, a charge pump configured to generate an output signal responsive to the output pulse from the edge detector, and an analog-to-digital (A/D) converter configured to convert the output signal into a digital value representing a frequency of the input clock signal wherein the charge pump includes a capacitor, and a charging transistor coupled in series between a power supply voltage and the capacitor, the charging transistor being configured to charge the capacitor responsive to the output pulse from the edge detector;
an internal clock signal generator configured to generate an internal clock signal responsive to the digital value representing the frequency of the input clock signal; and
a memory cell array configured to perform read and/or write operations responsive to the digital value representing the frequency of the input clock signal.

18. An integrated circuit memory device according to claim 17 wherein the edge detector is configured to generate the output pulse responsive to rising and falling edges of the input clock signal.

19. An integrated circuit memory device according to claim 18 wherein the edge detector includes:
a delay circuit configured to generate a delayed clock signal by delaying the clock signal by a time period; and
a logic circuit configured to combine the clock signal and the delayed clock signal to generate the output pulse.

20. An integrated circuit memory device according to claim 17 wherein the analog-to-digital (A/D) converter comprises a flash analog-to-digital converter.

21. An integrated circuit memory device according to claim 17 wherein the output pulse generated by the edge detector has a constant time delay between its rising edge and its falling edge.

* * * * *